United States Patent [19]

LaRosa et al.

[11] Patent Number: 4,721,919
[45] Date of Patent: Jan. 26, 1988

[54] CLASS G BRIDGE AMPLIFIER WITH UNIPOLAR SUPPLIES

[75] Inventors: David A. LaRosa; David W. Osburn, both of Kokomo, Ind.

[73] Assignee: General Motors Corporation, Detroit, Mich.

[21] Appl. No.: 944,059

[22] Filed: Dec. 22, 1986

[51] Int. Cl.$^4$ ............................................ H03F 3/20
[52] U.S. Cl. ..................................... 330/146; 330/297
[58] Field of Search ................. 330/146, 297, 202, 273

[56] References Cited

U.S. PATENT DOCUMENTS

| | | | |
|---|---|---|---|
| 4,329,657 | 5/1982 | Kamiya | 330/297 |
| 4,404,527 | 9/1983 | Schertz et al. | 330/84 |
| 4,443,771 | 4/1984 | Ishii et al. | 330/297 |
| 4,518,928 | 5/1985 | Ishii | 330/297 |
| 4,560,946 | 12/1985 | Yokoyama | 330/149 |

FOREIGN PATENT DOCUMENTS 108408  6/1984  Japan ............................. 330/297

OTHER PUBLICATIONS

Highest Efficiency and Super Quality Audio Amplifier Using MOS Power FETs in Class G Operation. (Sampei, Ohashi, Ohta, Inoue), IEE Transactions on Consumer Electronics, vol. CE-24, No. 3, Aug. 1978.

Primary Examiner—James B. Mullins
Attorney, Agent, or Firm—Robert M. Sigler

[57] ABSTRACT

Conventional bridged amplifiers obtain output voltage range and DC operating voltage from full and half voltage outputs of a voltage divider. A low voltage unipolar supply powers the voltage divider for small signals. A peak detector selects the higher peak amplifier output; and a voltage follower with an output voltage range from a high voltage unipolar supply maintains an output voltage a predetermined level above the peak. The output of the follower controls a transistor connecting the high voltage supply to the full voltage output of the voltage divider to allow the bridged amplifier outputs to increase above the low voltage supply as necessary in class G operation. An input amplifier obtains output voltage range and DC operating level from the full and half voltage outputs of the voltage divider and has differential outputs connected in opposite phase to the inputs of the bridged amplifiers so that the DC operating level shifts with the output voltage range to maintain an undistorted output across the load in spite of clipped individual outputs due to the lack of oppositely poled supplies. The predetermined voltage is large enough to ensure that the transistor can provide sufficient current from the high voltage supply at high output levels in class G operation.

3 Claims, 2 Drawing Figures

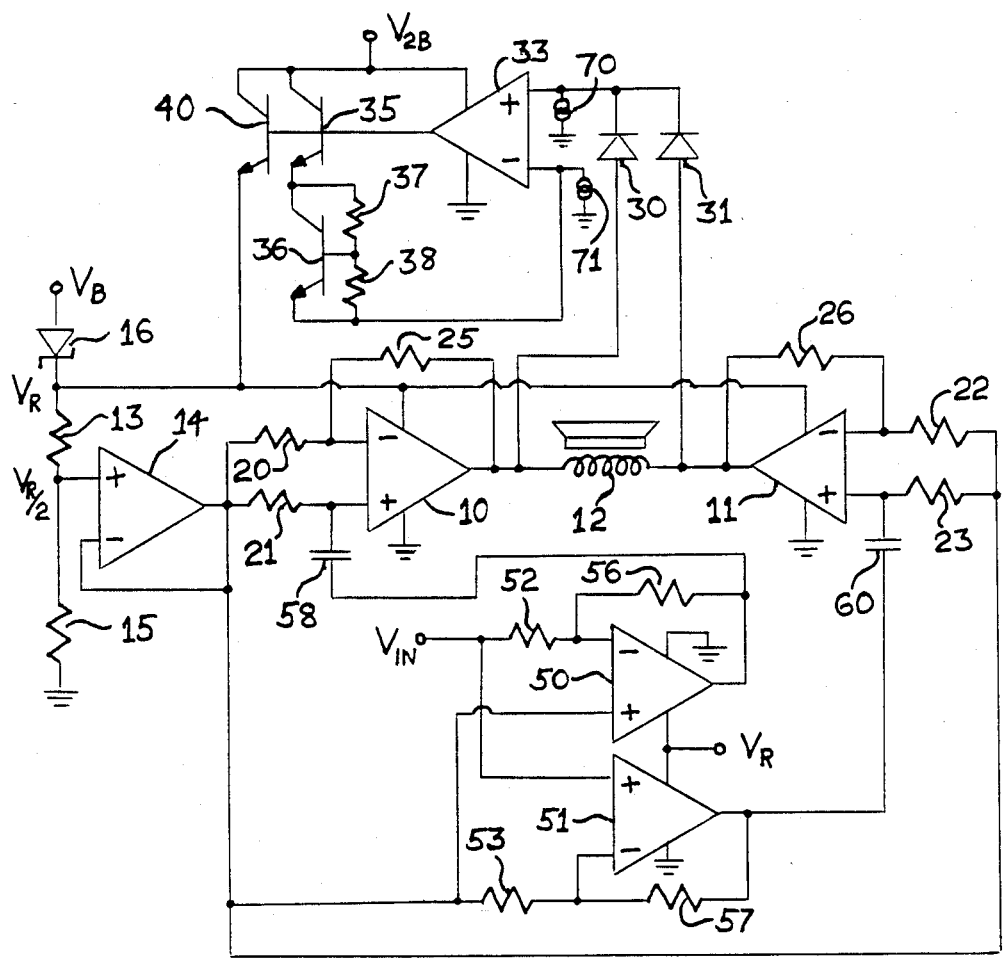
Fig. 1
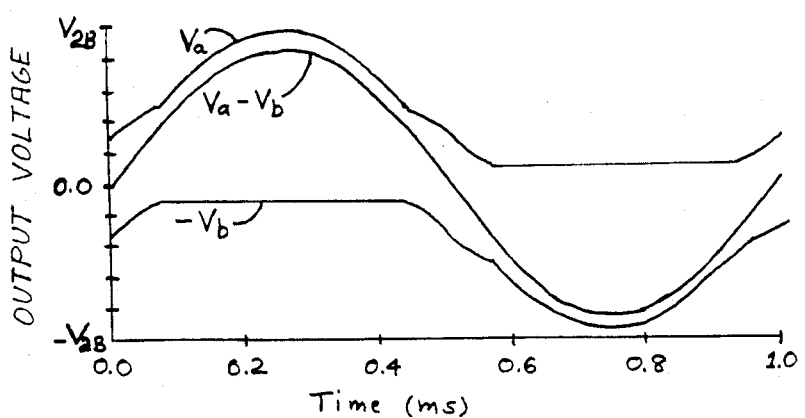
Fig. 2 AMPLIFIER OUTPUT

CLASS G BRIDGE AMPLIFIER WITH UNIPOLAR SUPPLIES

BACKGROUND OF THE INVENTION

This invention relates to a bridge amplifier, and particularly to a high power bridge amplifier suitable for use in motor vehicle music reproduction systems.

The demand for power audio amplifiers with more output power capability has been growing. However, when such amplifiers are set to avoid clipping of the dynamic extremes of a music signal, the average power is 10 to 20 times less than that needed for peak instantaneous power. In addition, an amplifier used in a vehicle music reproduction system must often fit in a very limited space, with consequent restrictions on the size of heat sinks and thus on average power dissipation. In order to include a high power amplifier in a vehicle music system, a more efficient amplifier configuration than the typical class B or AB would be advantageous.

A class G amplifier provides the efficient operation desired for minimization of heat sink requirements in a high power amplifier. In a class G amplifier, a first fixed supply voltage is used across the output section until the output voltage attempts to rise above a voltage somewhat below the first fixed supply voltage, whereupon a second, higher voltage power supply is switched in as needed to follow the amplified signal and allow the output voltage to increase. The superior efficiency of class G amplifiers, compared to class B, has been described in the literature, for example in the article "Highest Efficiency and Super Quality Audio Amplifier Using MOS Power FETS in Class G Operation" by Sampei, Ohashi, Ohta and Inoue, IEEE Transactions on Consumer Electronics Vol. CE-24(3), p. 300–306, Aug., 1978. Class G amplifiers have been used mainly in home applications, however, since they generally use both positive and negative power supplies at two voltages. Such power supplies are easily obtained through transformers from home 115 volt AC power; but the low voltage, unipolar, DC supply of a motor vehicle presents a challenge. Class G bridge amplifiers continue to remain attractive for high power, low space applications, however, due to their lower part content as well as their higher efficiency. Thus, a class G bridge amplifier capable of operation from unipolar supplies is desirable.

SUMMARY OF THE INVENTION

The amplifier of this invention biases conventional first and second amplifiers with outputs connected across a load in bridge configuration from a voltage divider powered through a first unidirectional current means from a first unipolar supply at a first voltage, the voltage divider having a full voltage output to determine the output range of the first and second amplifiers and a half voltage output to provide the DC operating voltage for the first and second amplifiers. To this is added a peak detector, a voltage follower and a specially biased input amplifier.

The peak detector connects the outputs of the first and second amplifiers in a highest wins configuration at the input of the voltage follower, which has an output range determined by a second unipolar supply at a greater voltage than the first and which maintains its own output a predetermined voltage above the higher of the outputs of the first and second amplifiers. The output of the follower is connected through a second unidirectional current means to the full voltage output of the voltage divider in a highest wins configuration with the first unipolar supply and further is effective, when forward biased, to supply current from the second unipolar supply.

The input amplifier has an output voltage range determined by the full voltage output of the voltage divider and a DC operating voltage obtained from the half voltage output of the voltage divider. It has differential outputs connected in opposite phase to the inputs of the first and second amplifiers.

The class G bridge amplifier of the invention thus supplies the voltage divider, which determines the component amplifier output ranges and DC operating voltages, from the first supply except when the output increases above a predetermined voltage, whereupon it switches in current from the second supply and allows the voltage supplied to the voltage divider to increase as necessary to permit the output voltage to increase above that predetermined voltage and to permit the DC operating voltage to increase as necessary to avoid distortion across the load, even when the outputs of the individual first and second amplifiers are both distorting due to the lack of oppositely poled supplies. Further details and advantages will be apparent from the accompanying drawings and following description of the preferred embodiment.

SUMMARY OF THE DRAWINGS

FIG. 1 is a circuit diagram of an amplifier according to the invention.

FIG. 2 shows several plots of voltage vs. time which illustrate the output of the amplifier of FIG. 1.

DESCRIPTION OF A PREFERRED EMBODIMENT

Referring to FIG. 1, a bridge amplifier includes a first op amp (operational amplifier) 10 and a second op amp 11 having outputs connected across a load 12, which is generally the voice coil of a speaker. Op amps 10 and 11 receive operating power to determine their output voltage ranges from a point marked $V_R$ in the drawing, which point is at the top of a voltage divider comprising two resistors 13 and 15 in series. The lower resistor 15 has another end connected to ground; and the upper resistor 13 has another end connected to the cathode of a Schottky diode 16, which has an anode connected to a unipolar power supply of voltage $V_B$. Resistors 13 and 15 have identical resistance, so that their junction, marked $V_R/2$, forms a half voltage output while the junction marked $V_R$ forms a full voltage output of the voltage divider.

The half voltage output $V_R/2$ of the voltage divider is connected to the non-inverting input of an op amp 14 having an output connected to its inverting input to form a unity voltage follower. Voltage follower op amp 14 provides the extra driving power desirable for the maintenance of the DC operating level of the other op amps in the circuit. The output of op amp 14, at voltage $V_R/2$, is connected through a resistor 20 to the inverting input of op amp 10 and through a resistor 21 to the non-inverting input of op amp 10. Likewise, it is connected through a resistor 22 to the inverting input of op amp 11 and through a resistor 23 to the non-inverting input of op amp 11. Thus the DC operating or quiescent voltage of op amps 10 and 11 is $V_R/2$. Negative feedback resistors 25 and 26 are connected around op amps 10 and 11, respectively. Thus, op amps 10 and 11 are connected and biased as a bridge amplifier with op amp 10 having an output voltage $V_a$ and op amp 11 having an output voltage $V_b$. Voltages $V_a$ and $V_b$ each have a maximum voltage swing between voltages somewhat above ground and somewhat below $V_R$. If oppositely phased input signal voltages are applied to the non-inverting inputs of op amps 10 and 11 with voltage supply $V_B$, the signals are amplified and applied across load 12 in opposite phase, so that the maximum voltage across the load is nearly twice $V_R$ in typical bridge amplifier operation.

In order to improve the efficiency of the amplifier in music applications, such as in a vehicle radio, additional apparatus is added to produce class G operation, wherein smaller amplitude signals are amplified and provided across load 12 within the limits of a voltage swing less than 2 times $V_B$ but larger signals switch in a higher voltage supply to allow the supply voltage powering op amps 10 and 11 to increase for their duration to follow the amplified input and produce the larger voltage swing without clipping. The larger voltage unipolar supply is labeled $V_{2B}$ and is at a higher voltage than $V_B$, typically twice as high. Voltage $V_{2B}$ may be obtained through voltage converter apparatus from supply $V_B$ or from a totally separate supply. In the case of a vehicle having a 12/24 volt power supply, voltages $V_B$ and $V_{2B}$ are available at specified voltages from the 12 and 24 volt supplies.

A peak detector comprises a diode 30 having an anode connected to the output of op amp 10 and a diode 31 having an anode connected to the output of op amp 11, the cathodes of diodes 30 and 31 being connected together. The higher of the outputs of op amps 10 and 11 is passed through the peak detector to a voltage follower comprising an op amp 33 having a non-inverting input connected to the cathodes of diodes 30 and 31, op amp 33 being powered by supply $V_{2B}$ for an output voltage range of that voltage. The output of op amp 33 is connected to the base of an NPN transistor 35 having a collector connected to power supply $V_{2B}$ and an emitter connected to the collector of an NPN transistor 36. Transistor 36 has a resistor 37 connected across its collector-base junction and a resistor 38 connected across its base-emitter junction; and its emitter is connected in negative feedback to the inverting input of op amp 33. The output of op amp 33 is further connected to the base of an NPN transistor 40 having a collector connected to power supply $V_{2B}$ and an emitter connected to the junction of diode 16 and resistor 13.

It is desired that transistor 40 be turned on to supply current from supply $V_{2B}$ while tracking the higher of $V_a$ and $V_b$ before the latter clips somewhat below $V_B$. To this end, an upward offset is provided for the output of follower op amp 33. Transistor 36, resistor 37 and resistor 38 comprise a $V_{be}$ multiplier in the negative feedback loop of follower op amp 33. Since resistor 38 is connected across the base-emitter junction of transistor 36 and the base current of transistor 36 is negligible compared to the current through resistors 37 and 38, the total voltage across resistors 37 and 38 equals the resistance ratio of resistors 37 and 38 times the $V_{be}$ of transistor 36, the voltage being adjustable with the resistance value of resistor 37. There are understood current sinks 70 and 71 to ground from the non-inverting and inverting inputs of op amp 33 which, in standard bipolar technology, maintain equal currents to ground from those points. Therefore, the voltage on the output of op amp 33 equals the higher of $V_a$ or $V_b$ minus the diode drop across diode 30 or 31 plus the voltage across transistor 36 as determined by the resistance ratio of resistors 37 and 38 plus the $V_{be}$ of transistor 35. As long as this voltage minus the $V_{be}$ of transistor 40 does not exceed $V_B$ minus the diode drop across diode 16, transistor 40 will remain turned off and $V_R$ will be determined by voltage $V_B$. However, when the output voltage of op amp 33 increases sufficiently to forward bias the base-emitter junction of transistor 40, transistor 40 will turn on and $V_R$ will follow the peak of the higher of voltages $V_a$ and $V_b$. Thus the output will act as a class G amplifier, using the smaller voltage power supply for small outputs and switching in the higher voltage power supply only as necessary for larger output voltages. The offset voltage is chosen s that the second unipolar supply is switched in well before the amplifier output reaches the level below $V_B$ at which op amps 10 or 11 would clip.

In the design of the voltage follower, the difference between the output voltage of op amp 33 and the peak voltage from the first and second amplifers is important. Starting with the peak voltage, there is a diode drop from diode 30 or 31, whichever is active, an increase due to op amp 33 and a $V_{be}$ drop in transistor 40 to arrive at $V_R$. In the feedback loop of op amp 33, the $V_{be}$ drop of transistor 38 will compensate for the diode drop of diode 30 or 31 if both are NPN. If a PNP diode must be used for 30 and 31, the compensation will not be exact. The $V_{be}$ drop of transistor 35 will compensate for that of transistor 40 at equivalent current levels. However, at high amplifier outputs in class G operation, transistor 40 will be conducting far more current than transistor 35 and will thus have a greater $V_{be}$. Resistor 37 is therefore adjusted to compensate for this higher $V_{be}$ of transistor 40 at its maximum current levels and the slight disparity of the diode drop of diode 30 or 31, so that the output of op amp 33 will exceed the peak voltage by at least an amount great enough to turn on transistor 40 sufficiently to supply the maximum output current levels required. It is desirable to minimize the excess voltage difference over what is absolutely necessary, however, since a higher voltage difference tends to reduce the efficiency gain which is the purpose of the circuit. In practice, with a 12/24 volt power supply and typical devices, a difference or threshold voltage of about 2 volts is typical. Thus class G operation will begin about 2 volts below $V_B$. If the current sources 70 and 71 are made dependent on the $V_{be}$ drop of transistor 40 or on $V_R$, however, this threshold voltage can be dropped to about 1 volt, with a consequent further improvement in amplifier efficiency.

However, there is an additional circuit constraint necessary to prevent gross distortion when the higher voltage is switched in due to the lack of negative power supplies. The input amplifier must have a DC or quiescent operating point obtained from the half voltage output of the voltage divider, $V_R/2$, so that the DC operating point increases at half the rate of $V_R$ as the higher voltage supply is switched in. Therefore, the input comprises a pair of op amps 50 and 51 powered from $V_R$ to determine the output voltage ranges and provided with a DC operating voltage of $V_R/2$. The non-inverting input of op amp 50 and the inverting input of op amp 51, through an input resistor 53, are connected to the output of op amp 14. The input voltage $V_{in}$ may be provided to the non-inverting input of op amp 51 and, through an input resistor 52, to the inverting input of op amp 50. Op amps 50 and 51 are provided with negative feedback through resistors 56 and 57, respectively; and the outputs of op amps 50 and 51 are connected to the non-inverting inputs of op amps 10 and 11, respectively, through capacitors 58 and 60, respectively.

The performance of the amplifier of this invention is seen in the curves of FIG. 2. In these curves, an input sine wave is of sufficient amplitude to cause power supply switching to the higher power supply voltage $V_{2B}$ for the majority of the curves. Both $V_a$ and $V_b$ are seen to be clipped on one side, since there is no negative supply voltage to increase in the negative direction. However, due to the biasing of the input amplifier according to the invention, the voltage across the load, $V_a-V_b$, is an undistorted sine wave following the input.

The embodiments of the invention in which an exclusive property or privilege is claimed are defined as follows:

1. A bridge audio amplifier comprising, in combination:
   first and second unipolar supplies of electrical power at first and second voltages, respectively, the second voltage being greater than the first;
   a voltage divider powered through first unidirectional current means from the first unipolar supply, the voltage divider having full and half voltage outputs;
   first and second amplifiers having outputs with a load connected thereacross and individual output voltage ranges determined by the full voltage output of the voltage divider, the first and second amplifiers obtaining a DC operating voltage from the half voltage output of the voltage divider;
   an input amplifier means adapted to receive an input voltage signal for amplification and further having differential outputs with output ranges determined by the full voltage output of the voltage divider and connected in opposite phase to the inputs of the first and second amplifiers, the input amplifier means obtaining a DC operating voltage from the half voltage output of the voltage divider;
   a peak detector responsive to the outputs of the first and second amplifiers to generate a peak voltage varying with the greater;
   a voltage follower having an output voltage range determined by the second supply and responsive to the output of the peak detector to maintain its own output voltage a predetermined voltage above the peak voltage; and
   second unidirectional current means connecting the output of the voltage follower to the full voltage output of the voltage divider in a highest wins configuration with the first unipolar supply, the second unidirectional current means being effective, when forward biased, to supply current from the second unipolar supply, whereby class G bridge operation is obtained without distortion from unipolar supplies.

2. The bridge audio amplifier of claim 1 in which:
   the peak detector comprises diodes connecting the outputs of each of the first and second amplifiers to the input of the voltage follower;
   the second unidirectional current means comprises a transistor having a base connected to the output of the voltage follower, a collector connected to the second unipolar supply and an emitter connected to the full voltage output of the voltage divider, the transistor having a $V_{be}$ which increases with current therethrough; and
   the voltage follower includes circuit elements effective to maintain its output voltage above the peak voltage by a predetermined voltage at least equal to the diode drop of one of the diodes plus the maximum $V_{be}$ of the transistor, whereby the transistor is adequately powered to fully supply the first and second amplifiers with current from the second unipolar supply at maximum output voltage swings across the load.

3. The bridge audio amplifier of claim 2 in which the circuit elements comprise an operational amplifier with a non-inverting input provided with the peak detector output and an output connected in negative feedback to the inverting input through the base-emitter junction of a first additional transistor in series with a $V_{be}$ multiplier, the $V_{be}$ multiplier comprising a second additional transistor having a collector connected to the emitter of the first additional transistor, an emitter connected to the inverting input of the operational amplifier and resistors across the base-emitter and collector-base junctions, the first additional transistor having a collector connected to the second supply and current sinks connecting the inverting and non-inverting inputs of the operational amplifier to ground.

* * * * *